United States Patent
Zeng

(10) Patent No.: US 12,402,475 B2
(45) Date of Patent: Aug. 26, 2025

(54) DISPLAY PANEL AND DISPLAY DEVICE

(71) Applicant: Hubei Yangtze Industrial Innovation Center of Advanced Display Co., LTD., Wuhan (CN)

(72) Inventor: Yang Zeng, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 497 days.

(21) Appl. No.: 17/676,002

(22) Filed: Feb. 18, 2022

(65) Prior Publication Data
US 2023/0097396 A1    Mar. 30, 2023

(30) Foreign Application Priority Data

Sep. 30, 2021   (CN) ........................ 202111163506.0

(51) Int. Cl.
| | |
|---|---|
| H10K 50/86 | (2023.01) |
| G06V 40/13 | (2022.01) |
| H10K 59/12 | (2023.01) |
| H10K 59/122 | (2023.01) |
| H10K 59/13 | (2023.01) |
| H10K 59/131 | (2023.01) |
| H10K 59/65 | (2023.01) |

(52) U.S. Cl.
CPC ....... *H10K 50/865* (2023.02); *G06V 40/1318* (2022.01); *H10K 59/122* (2023.02); *H10K 59/131* (2023.02); *H10K 59/65* (2023.02)

(58) Field of Classification Search
CPC .... H10K 50/865; H10K 59/122; H10K 59/65; H10K 59/126; H10K 59/40; G06V 40/1318
See application file for complete search history.

(56) References Cited

U.S. PATENT DOCUMENTS

| | | | | |
|---|---|---|---|---|
| 2015/0060827 | A1* | 3/2015 | Sasaki | H10K 59/8792 257/40 |
| 2016/0103359 | A1* | 4/2016 | Kimura | G06F 3/0412 349/33 |
| 2021/0110131 | A1* | 4/2021 | Lin | H01L 27/14623 |
| 2021/0133423 | A1* | 5/2021 | Zhang | G02F 1/136209 |
| 2022/0165993 | A1* | 5/2022 | Leng | H10K 50/865 |
| 2022/0246706 | A1* | 8/2022 | Choi | H10K 59/1213 |

FOREIGN PATENT DOCUMENTS

| | | |
|---|---|---|
| CN | 109273497 A | 1/2019 |
| CN | 111106157 A | 5/2020 |
| CN | 111477635 A | 7/2020 |
| CN | 112364760 A | 2/2021 |

\* cited by examiner

*Primary Examiner* — Joshua Benitez Rosario
*Assistant Examiner* — Moataz Khalifa
(74) *Attorney, Agent, or Firm* — Anova Law Group, PLLC

(57) ABSTRACT

A display panel and a display device are provided. The display panel includes a first light-shielding layer including at least one first opening, and a device layer including a plurality of light-transmitting regions. The plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening. The display panel also includes an auxiliary light-shielding part, overlapping the second light-transmitting area.

20 Claims, 11 Drawing Sheets

DISPLAY PANEL AND DISPLAY DEVICE

CROSS-REFERENCE TO RELATED APPLICATION

This application claims priority of Chinese Patent Application No. 202111163506.0, filed on Sep. 30, 2021, the entire content of which is hereby incorporated by reference.

FIELD OF THE DISCLOSURE

The present disclosure generally relates to the field of display technology and, more particularly, relates to a display panel and a display device.

BACKGROUND

As technology of display devices advances, more and more electronic devices, such as mobile phones or personal digital assistants, have been integrated with display devices with light-sensing devices. In this way, a user may not only view image or text information from a display device, but also operate an electronic device through the information displayed on the display device.

For example, with development of technology, various display devices, such as mobile phones, tablet computers, and smart wearable devices, have a fingerprint recognition function. Before operating a display device with a fingerprint recognition function, a user may only need to touch the display device with his/her finger to perform authorization verification, and an authorization verification process may thus be simplified. Further, with gradual increase in application scenarios of fingerprint recognition functions, a fingerprint recognition area gradually evolves from a partial area to a full screen.

In an existing display device based on optical fingerprint recognition technology, a light sensor may be formed based on a semiconductor device. A characteristic that a semiconductor device exposed to light may generate leakage current may be used to realize fingerprint detection. Specifically, after light generated by a fingerprint recognition light source is reflected on a touch surface of a display device touched by a finger, reflected light may irradiate a light sensor. The light sensor may detect light intensity caused by fluctuation of fingerprint valleys and peaks, thereby generating a fingerprint spectrum.

However, accuracy of fingerprint recognition in existing technology needs to be further improved. As such, providing a display device for improving the accuracy of fingerprint recognition on a display panel is a problem to be addressed in the art.

SUMMARY

One aspect of the present disclosure includes a display panel. The display panel includes a first light-shielding layer including at least one first opening, and a device layer including a plurality of light-transmitting regions. The plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening. The display panel also includes an auxiliary light-shielding part, overlapping the second light-transmitting area.

Another aspect of the present disclosure includes a display device. The display device includes a display panel. The display panel includes a first light-shielding layer including at least one first opening, and a device layer including a plurality of light-transmitting regions. The plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening. The display panel also includes an auxiliary light-shielding part, overlapping the second light-transmitting area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that orientation words such as "upper," "lower," "left," and "right" in the present disclosure are used to describe orientation relationships from an angle shown in a drawing, and should not be understood as limitation on the present disclosure. In addition, when an element is formed "on" or "under" an other element, the element may not only be directly formed "on" or "under" the other element, but also be indirectly formed "on" or "under" the other element through an intervening element.

To improve accuracy of light-sensing detection, the inventor reversely investigated and studied factors that may affect accuracy of a light-sensing element. The inventor found through research that a light-sensing element may be affected by interference light. Taking light-sensing fingerprint recognition as an example, usually the interference light does not carry fingerprint information. The inventor further studied sources of the interference light.

Figure 1:
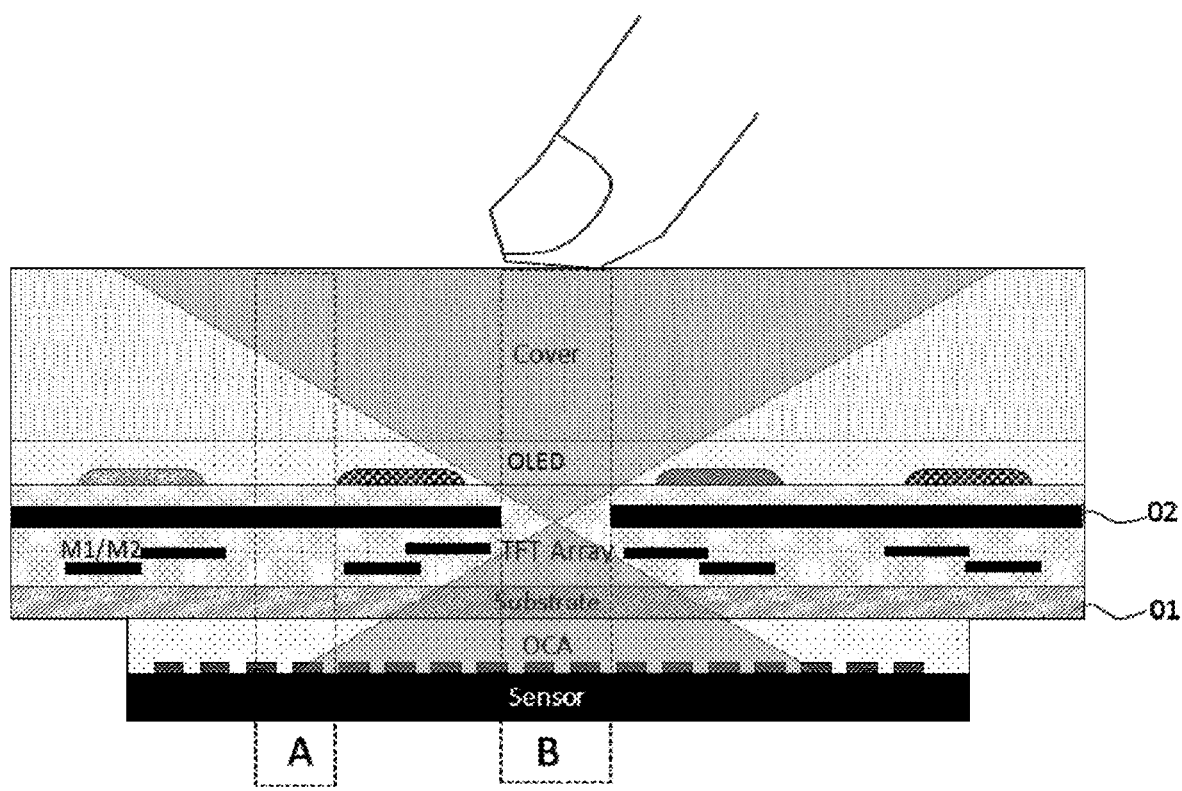
FIG. 1 illustrates a cross-sectional view of a display panel designed by the inventor during research.
Figure 2:
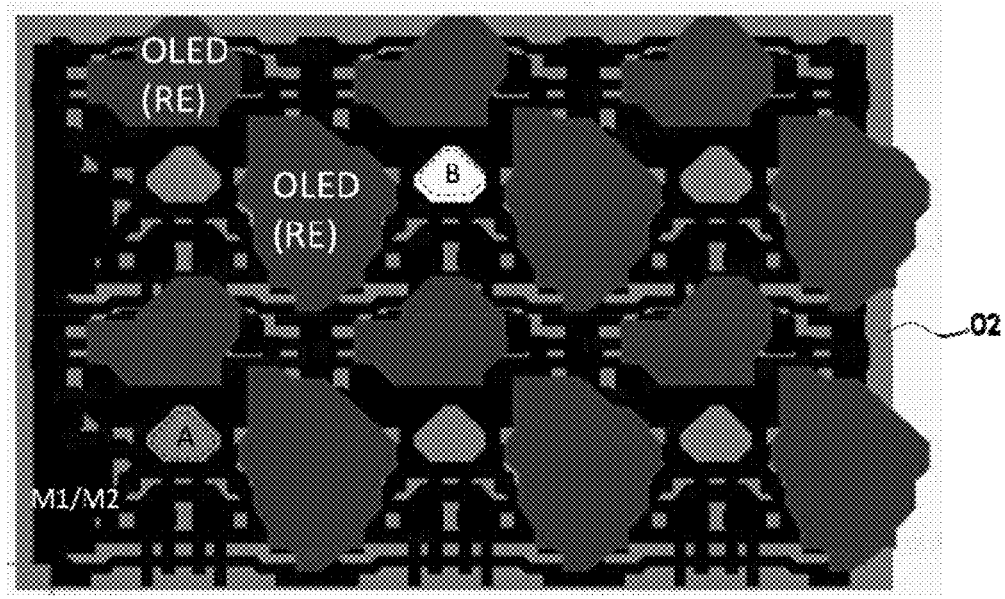
FIG. 2 illustrates a partial top view of a display panel designed by the inventor during research.

FIG. 1 illustrates a cross-sectional view of a display panel designed by the inventor during research. FIG. 2 illustrates a partial top view of a display panel designed by the inventor during research.

It is understandable that a light-sensing device may recognize external information such as a touch or a fingerprint by reading light with information, and thus a light channel corresponding to the light-sensing device may be required in a display panel. For a display panel with an integrated light-sensing recognition function, light emitted by a light-emitting device may be used as a light source for light-sensing. However, the light emitted by the light-emitting device may not directly irradiate the light-sensing device, otherwise the light may interfere with the detection. Accordingly, a light-shielding layer with a light channel may be disposed in the display panel. The light-shielding layer may not only shield interference light, but also do not affect normal information reading of the light-sensing device. However, in this case, the light-sensing device may still be affected by interference light. Along with in-depth research by the inventor, it is found that within a recognition range of a light-sensing device, light leakage or brightness differences at different areas may appear. Taking a light-sensing recognition range corresponding to a light channel as an example, as shown in FIG. 1 and FIG. 2, in an area covered by a light-shielding layer 02, except a film layer where the light-shielding layer 02 is located, other film layers may have different patterns. For example, other nontransparent film layers may be disposed between the light-shielding layer 02 and the substrate 01, such as other metal layers M1/M2. An overall projection pattern formed by the non-transparent layers on the substrate 01 may not be a complete pattern covering an entire surface. The overall projection pattern may be a pattern with openings or hollows, such as area A in FIG. 2.

In other words, the nontransparent films may block a certain amount of light, but the nontransparent films may not block light evenly. Accordingly, light leakage may happen at a portion of the nontransparent films. In addition, since light leakage at each area may not be uniform, light transmittance differences in different areas of the display panel may be observed. However, due to some reasons (described in detail below), the light-shielding layer 02 is often difficult to be absolutely nontransparent. Accordingly, although the light-shielding layer 02 may make an amount of light transmittance in area A smaller than an amount of light transmittance in area B (that is, an area corresponding to the light channel), compared an area covered by M1/M2, area A may still have a certain amount of light transmittance. As such, in one aspect, the light leakage of area A may spread to other areas forming interference light, and in another aspect, the light leakage of area A may make the amount of light in area A and surroundings of area A be different from other areas. As a result, misrecognition of the light-sensing device may happen, and ultimately detection accuracy may be affected.

Figure 3:
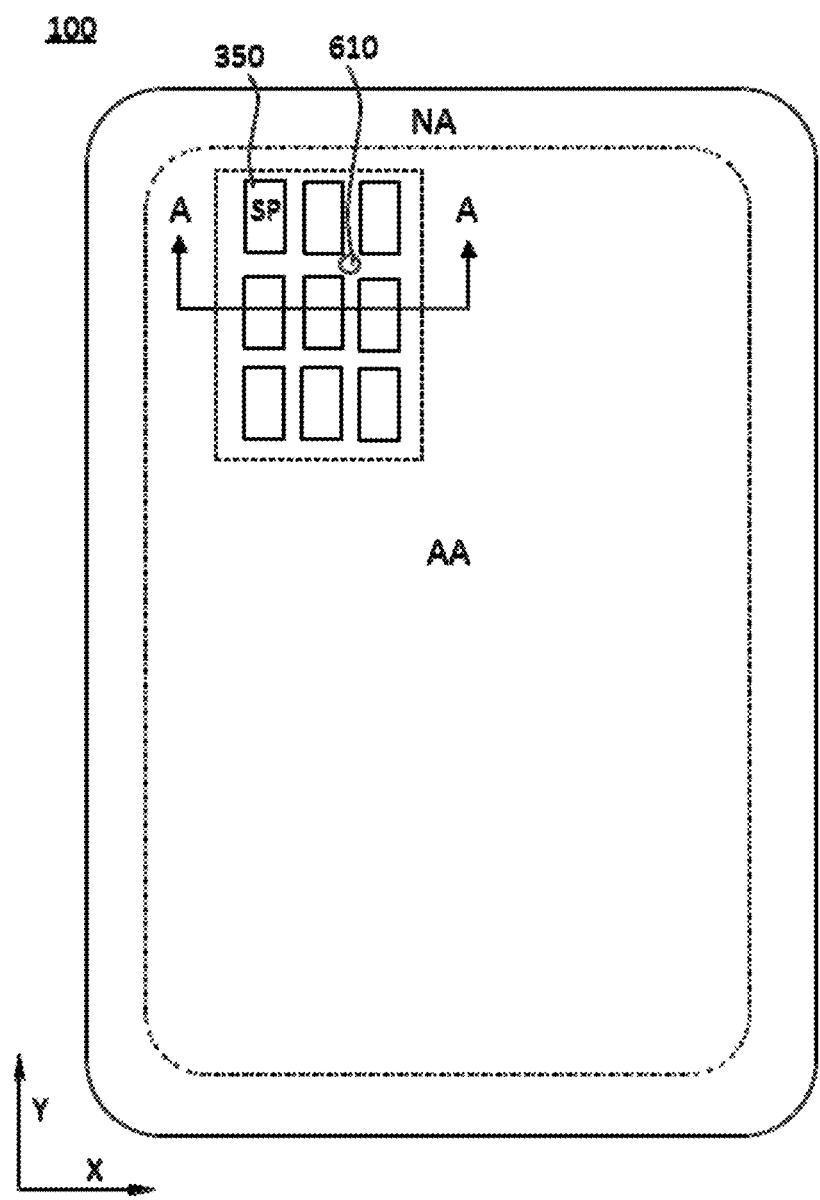
FIG. 3 illustrates a top view of a display panel consistent with the disclosed embodiments of the present disclosure.
Figure 4:
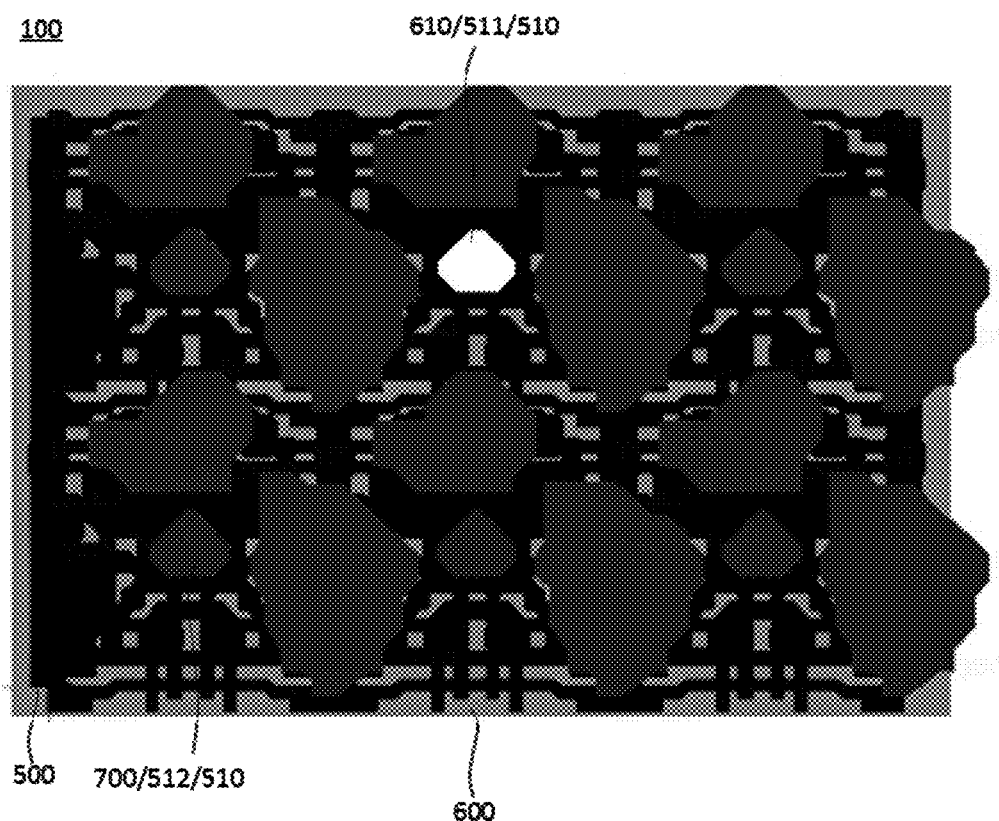
FIG. 4 illustrates a partial enlarged view of a display panel shown in FIG. 3, consistent with the disclosed embodiments of the present disclosure.

The present disclosure provides a display panel and a display device. FIG. 3 illustrates a top view of a display panel consistent with the disclosed embodiments of the present disclosure. FIG. 4 illustrates a partial enlarged view of the display panel shown in FIG. 3.

Optionally, the display panel 100 may be divided into a display area AA and a non-display area NA surrounding the display area AA. A dotted frame in FIG. 3 indicates a boundary between the display area AA and the non-display area NA. The display area AA is an area used by the display panel to display an image, and usually includes a plurality of pixel units arranged in an array. Each pixel unit includes a light-emitting device (for example, a diode) and a control element (for example, a thin film transistor constituting a pixel driving circuit), corresponding to the pixel unit. The non-display area NA surrounds the display area AA, and usually includes a peripheral driving component, a peripheral wiring, and a fan-out area.

The display panel 100 also includes a first light-shielding layer 600, a device layer 500, and an auxiliary light-shielding part 700.

The first light-shielding layer 600 includes at least one first opening 610. The first opening 610 penetrates the first light-shielding layer 600.

The device layer 500 includes a plurality of light-transmitting regions 510. The plurality of light-transmitting regions 510 includes a first light-transmitting region 511 and a second light-transmitting region 512. The first light-transmitting area 511 overlaps at least one of the first openings 610. The second light-transmitting area 512 overlaps a portion of the first light-shielding layer except the at least one first opening.

The auxiliary light-shielding part 700 overlaps the second light-transmitting area 512.

In this configuration, the auxiliary light-shielding part is designed to block the second light-transmitting area. Accordingly, a light leakage problem leading to misrecognition of the light-sensing element or the light-sensing device may be avoided, and accuracy of light-sensing detection may thus be improved.

Optionally, the first opening 610 is a light channel for transmitting light information. For example, light emitted by a light source for light-sensing detection irradiates a touch surface, passes through the light channel formed by the first opening 610 after being reflected by the touch surface (or also including a touch body), and is then received by the light-sensing detection element on a side of the first opening away from the touch surface.

Optionally, the device layer 500 may include a plurality of sublayers. Each sublayer may include different devices. Optionally, these devices are made of nontransparent materials.

Optionally, the devices in the device layer 500 may include capacitors, electrodes, lines, circuit devices, or a combination thereof.

Optionally, the device layer 500 also includes a nontransparent area 520. The nontransparent area 520 may be formed by a nontransparent device on each sub-layer in the device layer 500. Projections of these devices on a direction perpendicular to a plane where the display panel 100 is located (or orthographic projections on the plane where the display panel 100 is located) together form the nontransparent area 520. An area not blocked by the devices forms the light-transmitting area 510.

Optionally, the light-transmitting area 510 includes at least one first light-transmitting area 511 and at least one second light-transmitting area 512. For ease of description, in an exemplary embodiment, the light-transmitting area 510 includes one first light-transmitting area. That is, at least two second light-transmitting areas 512 are adjacent to the first light-transmitting area 511. Of course, in some other embodiments of the present disclosure, the light-transmitting area may include a plurality of first light-transmitting areas and a plurality of second light-transmitting areas.

Optionally, the first light-transmitting area 511 overlaps at least one of the first openings 610. The second light-transmitting area 512 overlaps the non-first openings. The auxiliary light-shielding part 700 overlaps the second light-transmitting area 512. It should be noted that above-mentioned "overlap" refers to overlap of orthographic projections of two structures on a plane where the display panel 100 is located, and does not have to be contact overlap or overlap in a contact manner.

Optionally, the first light-transmitting area 511 overlaps at least one of the first openings 610. In other words, the first light-transmitting area 511 also provides a transmitting channel for light information to be read by the light-sensing element.

Optionally, the second light-transmitting area 512 overlaps the non-first opening, that is, the second light-transmitting area 512 overlaps an area where the non-first opening is located. In other words, the second light-transmitting area 512 and the first opening 610 do not overlap. However, the second light-transmitting area 512 overlaps an area where the body of the first light-shielding layer 600 is located. In other words, the second light-transmitting area 512 overlaps an area of the first light-shielding layer 600 where the first opening 610 is not located.

Optionally, the display panel 100 includes a plurality of first openings 610. The plurality of first openings 610 are evenly distributed on an area requiring light-sensing recognition. For example, the plurality of first openings 610 may be arranged in an array.

Optionally, the display panel 100 includes a plurality of light-transmitting regions 510 arranged in an array, and some of the plurality of light-transmitting regions are the first light-transmitting regions 511. The first light-transmitting regions 511 are uniformly distributed in the array of the light-transmitting regions 510, and in a certain period/ repetition/pattern, such that first light-transmitting regions 511 may better fit the first openings 610. For example, the first light-transmitting areas 511 may match the arrangement of the first openings 610, and may also be arranged in an array.

Optionally, the first light-shielding layer is located on a side of the light-transmitting area facing the light-emitting surface or the touch surface.

Optionally, the display panel 100 may include a plurality of auxiliary light-shielding parts 700. The plurality of auxiliary light-shielding parts 700 may form a plurality of islands or block structures spaced apart from each other, and arranged in a certain regularity.

Optionally, the auxiliary light-shielding part 700 and the second light-transmitting area 512 may be in a one-to-one correspondence.

Optionally, the auxiliary light-shielding part 700 overlapping the second light-transmitting area 512 may be the auxiliary light-shielding part 700 completely covering the second light-transmitting area 512. In other words, an orthographic projection of the second light-transmitting area 512 on the plane where the display panel 100 is located falls within an orthographic projection of the auxiliary light-shielding part 700 on the plane where the display panel 100 is located.

Optionally, a width of the second light-transmitting area 512 is greater than or equal to approximately μm 5 μm. In other words, the size of the second light-transmitting area 512 in any direction parallel to the plane where the display panel 100 is located is greater than or equal to approximately 5 μm. Otherwise, the light-transmitting area does not belong to the second light-transmitting area. It should be noted that the light-transmitting area 510 of the device layer 500 may also include other light-transmitting areas except the first light-transmitting area 511 and the second light-transmitting area 512. These other light-transmitting areas do not correspond to the first opening 610, and their maximum width may be less than approximately 5 μm.

In other words, at least a part of the light-transmitting areas with a width less than approximately 5 μm does not overlap the auxiliary light-shielding part.

In one aspect, the inventor found that additionally providing the auxiliary light-shielding part may also occupy a certain amount of internal space of the display panel, and patterning the auxiliary light-shielding part may also have requirements on a fabrication process. In another aspect, the inventor found that only when reaching a certain level, light leakage of a light-transmitting area may have a significant penetrating effect on the first light-shielding layer, and may be finally recognized by the light-sensing device. A size of the light-transmitting area that may achieve this level of light leakage may need to be greater than or equal to approximately 5 μm. Accordingly, in the present disclosure, some light-transmitting areas do not need to be provided with auxiliary light-shielding parts overlapping these light-transmitting areas. In this way, while the light-sensing detection effect may be improved, not only process difficulty may be reduced, but also the auxiliary light-shielding part may be prevented from occupying too much space.

In addition, above analysis indicates that, in some other embodiments, a size of the light-transmitting area exposed by the auxiliary light-shielding part may be less than approximately 5 μm. A size of a certain structure mentioned above is a size of the structure in any direction parallel to the plane where the display panel 100 is located.

In some embodiments of the present disclosure, the orthographic projection of the second light-transmitting area 512 on the plane where the display panel 100 is located falls within the orthographic projection of the auxiliary light-shielding part 700 on the plane where the display panel 100 is located. In addition, an edge of the orthographic projection of the auxiliary light-shielding part 700 on the plane where the display panel 100 is located exceeds an edge of the orthographic projection of the second light-transmitting area 512 on the plane where the display panel 100 is located by approximately 1 μm~2 μm. That is, a distance between the edge of the orthographic projection of the auxiliary light-shielding part 700 on the plane where the display panel 100 is located to the edge of the orthographic projection of the second light-transmitting area 512 on the plane where the display panel 100 is located is approximately between 1 μm and 2 μm. In this way, the light-shielding reliability of the auxiliary light-shielding part may be improved. Even when an alignment deviation occurs, the second light-transmitting area may still be effectively shielded.

In some embodiments of the present disclosure, the first light-shielding layer 600 is a continuous insulating layer.

Optionally, the term "continuous" here means that, in the light-sensing recognition area, the first light-shielding layer 600 with the plurality of first openings 610 is an integrally formed continuous structure. In other words, a plurality of second light-transmitting regions may correspond to a same first light-shielding layer.

Optionally, the first light-shielding layer 600 is continuous in the display area AA.

In this configuration, the light-shielding layer is made of an insulating layer. In one aspect, the insulating layer is an insulating material, and some of the film layers in the display panel may be multiplexed as the insulating layer (refer to following content). Thus, fabrication process steps may be reduced, and film thickness may be decreased. In other aspect, a main light-shielding layer used for light-sensing detection is expected to be as continuous and complete as possible to avoid light leakage. However, when the existing metal layer of the display panel is multiplexed to make the main light-shielding layer that plays the main light-shielding function to save the manufacturing process, since the metal layer as a conductive film layer is often originally used to make lines, electrodes or other signal-transmitting device structures, the metal layer may not be formed into a continuous integrated structure. As a result, light leakage may occur in the main light-shielding layer made by multiplexing the metal layer, and detection accuracy may ultimately be affected. In other aspect, compared with the metal layer, the insulating layer may minimize the effects of interfering light, caused by self-reflection, on the light-sensing detection.

In some embodiments of the present disclosure, the light transmittance of the first light-shielding layer 600 is in a range approximately 1%-50%.

In this configuration, in combination with the overlapping design of the auxiliary light-shielding part and the second light-transmitting area, the requirements for the light transmittance of the first light-shielding layer may not be strict. Accordingly, the accuracy of light detection may be improved, and costs may be reduced.

In addition, in some embodiments of the present disclosure, due to the combination of the overlapping design of the auxiliary light-shielding part and the second light-transmitting area, thickness of the first light-shielding layer may be reduced. Accordingly, a thickness of the first light-shielding layer may not need to be increased to improve the light-shielding effect, and thus, thickness reduction of the display panel may be achieved.

Preferably, the light transmittance of the first light-shielding layer 600 is in a range approximately 5%-10%.

By research, the inventor found that the first light-shielding layer itself needs to be patterned to form the first opening (of course, in some embodiments, when the first light-shielding layer is formed by multiplexing other film layers in the display panel, other patterns may need to be introduced on the first light-shielding layer). Patterning the first opening may require steps such as exposure. When the light transmittance of the first light-shielding layer does not meet requirements, the first light-shielding layer may not be fully developed and exposed, eventually affecting the formation of the first opening. However, for the first light-shielding layer to be fully exposed and developed, a light-shielding ability may be sacrificed to some extent. In this way, the first light-shielding layer may not compensate the influence of light leakage in the second light-transmitting region. In one embodiment, by combining the first light-shielding layer whose transmittance meets the patterning requirement with the auxiliary light-shielding layer, not only the production requirements for the first opening may be met, but also the requirements for improving the accuracy of light-sensing detection may be met.

In some embodiments of the present disclosure, the auxiliary light-shielding part 700 includes a metal material. Since the metal material is basically completely nontransparent, a rate of light leakage may be greatly reduced. Accordingly, the metal material may compensate the brightness difference between the second light-transmitting area and the non-light-transmitting area of the device layer.

Optionally, the auxiliary light-shielding part 700 may be made by multiplexing other metal layers in the display panel, and the number of process steps and the thickness of the film layer may be reduced.

Optionally, the auxiliary light-shielding part 700 is located on a side of the first light-shielding layer 600 away from the display surface of the display panel 100. In this way, the first light-shielding layer may shield the reflection light of the auxiliary light-shielding part, thereby improving the display effect.

In this configuration, to take advantages of metal and non-metallic materials, the first light-shielding layer made of non-metallic material is combined with the auxiliary light-shielding part made of metal material. Considering the technical problems discovered by the inventor, the first light-shielding layer and the auxiliary light-shielding part are made of different materials with pertinence, such that the first light-shielding layer and the auxiliary light-shielding part assist each other. Accordingly, the precision of light-sensing detection and the display effect may be improved, and process difficulty and film layer thickness may be reduced. In addition, since the first light-shielding layer and the auxiliary light-shielding part are made of different materials, the first light-shielding layer and the auxiliary light-shielding part may be arranged adjacent to each other. Even when the first light-shielding layer and the auxiliary light-shielding part are in contact, the electrical performance may not be affected, and interference light may be prevented from leaking from the gap between the first light-shielding layer and the auxiliary light-shielding part. Thus, the light-shielding effect and the accuracy of light-sensing detection may be improved.

In some embodiments of the present disclosure, the auxiliary light-shielding part 700 is made of a metal material. Further, the auxiliary light-shielding part 700 is connected to a fixed electric potential or a shielding signal. In this way, the auxiliary light-shielding part may be prevented from generating a coupling signal affecting signal transmission of other devices, and the auxiliary light-shielding part may also form a structure for shielding interference signals, assisting other devices.

Optionally, the auxiliary light-shielding part 700 and other metal layers in the display panel may be in a same layer and may be made of a same material. In this way, the auxiliary light-shielding part 700 may be spaced between some devices. In combination with the auxiliary light-shielding part 700 being connected to a fixed electric potential or a shielding signal, the auxiliary light-shielding part 700 may play a role in shielding signal crosstalk, and may also decrease the fabrication process steps and reduce the thickness of the film layer.

In some embodiments of the present disclosure, the auxiliary light-shielding part 700 is located between the second light-transmitting area and the first light-shielding layer. In this way, the auxiliary light-shielding part may be closer to the first light-shielding layer relative to the device forming the second light-transmitting region. Even when light oscillates between the devices in the device layer, generating new light leakage, the new light leakage may be intercepted by the auxiliary light-shielding part before reaching the first light-shielding layer. Accordingly, the light leakage prevention effect may be further improved.

It should be noted that, in this configuration, the film layer where the second light-transmitting area is located may be understood as the film layer where the device or structure forming the second light-transmitting area is located.

In some embodiments of the present disclosure, the first opening 610 is an imaging small aperture used for small-aperture imaging.

Specifically, the first opening 610 may be set according to the principle of small-aperture imaging, such that the first opening 610 may be an imaging small aperture that may realize small-aperture imaging on the light-sensing device. As an example for description, a fingerprint of a finger touching the touch surface with the fingerprint detection function on the display panel may be detected. A plurality of light-emitting devices in the display layer may be multiplexed as a fingerprint recognition light source. After the light generated by the light-emitting device reaches the contact surface between the fingerprint and the touch surface, light reflection at a fingerprint valley and a fingerprint ridge may be different. The reflection light may be incident on the light-sensing layer (that is, the above-mentioned light-sensing element or the film layer where the light-sensing device is located) through the imaging small aperture (i.e., the first opening 610). When the aperture of the first opening 610 is small enough, through the principle of small-aperture imaging, the fingerprint image may be imaged on the light-sensing layer to realize fingerprint recognition.

Optionally, a diameter of the first opening 610 is in a range approximately between 5 μm and 20 μm. Accordingly, the light-transmitting aperture may be small enough to realize the small-aperture imaging. In addition, requirements of the process precision for forming the imaging small aperture may be met, and the process difficulty may be reduced.

In some embodiments of the present disclosure, the display panel also includes a substrate and an array layer located on a side of the substrate. The device layer is located on the array layer. The device layer includes a circuit structure, and at least a part of the circuit structure forms a non-light-transmitting area.

Figure 5:
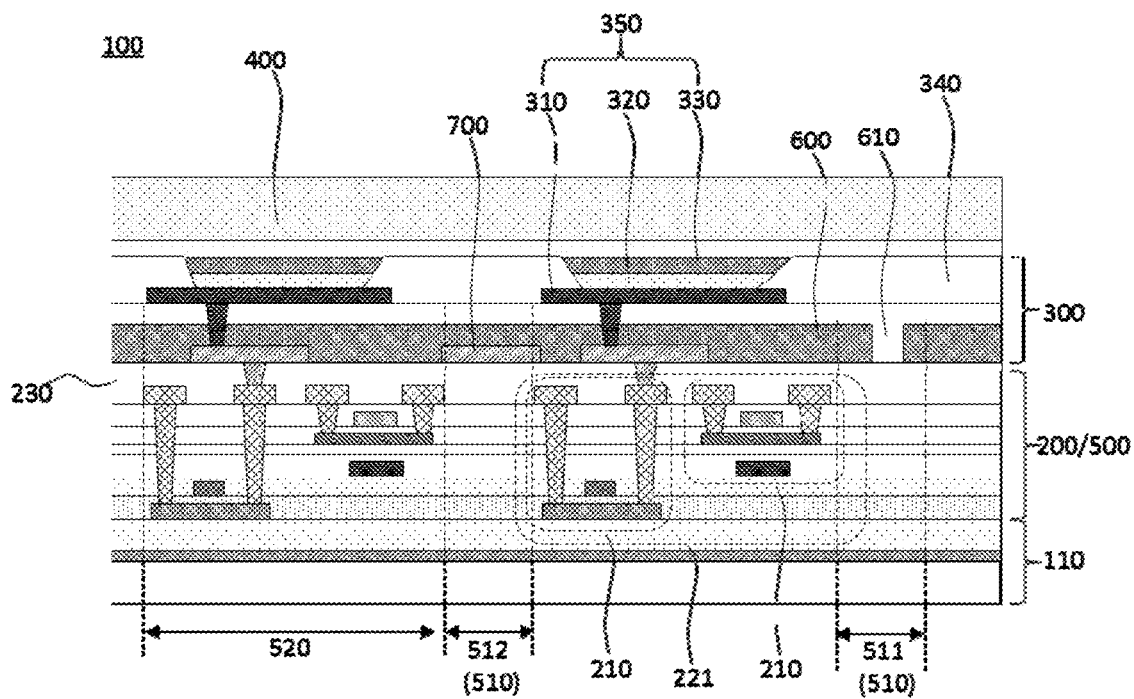
FIG. 5 illustrates a partial cross-sectional view along A-A direction in FIG. 3, consistent with the disclosed embodiments of the present disclosure.

FIGS. 3-5 illustrate a display panel consistent with the disclosed embodiments of the present disclosure. Specifically, FIG. 3 illustrates a top view of the display panel, and FIG. 4 illustrates a partial enlarged view of the display panel shown in FIG. 3. FIG. 5 illustrates a partial cross-sectional view along A-A direction in FIG. 3. The cross section is perpendicular to a plane where the display panel is located.

The display panel 100 includes a substrate 110. The substrate 110 (i.e., base substrate) may be flexible, and thus stretchable, foldable, bendable, or rollable, such that the flexible display panel may be stretchable, foldable, bendable, or rollable. The substrate 110 may be made of any suitable insulating material having flexibility. The substrate 110 is configured to block oxygen and moisture, preventing moisture or impurities from diffusing through the flexible substrate, and providing a flat surface on an upper surface of the flexible substrate. For example, the substrate may be made of polyimide (PI), polycarbonate (PC), polyethersulfone (PES), polyethylene terephthalate (PET), polyethylene naphthalate (PEN), polyarylates (PAR), glass-fiber reinforced plastics (FRP), and/or other polymer materials. The substrate 110 may be transparent, half-transparent, or nontransparent. Optionally, the display panel may also include a buffer layer on the substrate 110. The buffer layer may cover an entire upper surface of the substrate. Optionally, the substrate 110 may include a plurality of sub-layers, forming an organic-inorganic-organic alternately arranged structure.

The display panel also includes an array layer 200 on the substrate 110. Specifically, the array layer 200 is located on a side of the substrate 110 facing the display surface or the touch surface of the display panel 100. The array layer 200 may include a plurality of thin film transistors (TFT) 210 and a pixel circuit composed of thin film transistors, used for light-emitting components in the display layer.

The array layer 200 may also include a passivation layer. Optionally, the passivation layer may be made of inorganic materials such as silicon oxide or silicon nitride, or may be made of organic materials.

The array layer 200 may also include a planarization layer 230. Optionally, the planarization layer 230 is located on the passivation layer. The planarization layer 230 may include an organic material such as acrylic, polyimide (PI), or benzocyclobutene (BCB). The planarization layer has a planarization effect.

Optionally, the device layer 500 is located on the array layer 200. The device layer may include a circuit structure. At least a part of the circuit structure forms a non-light-transmitting area.

Figure 6:
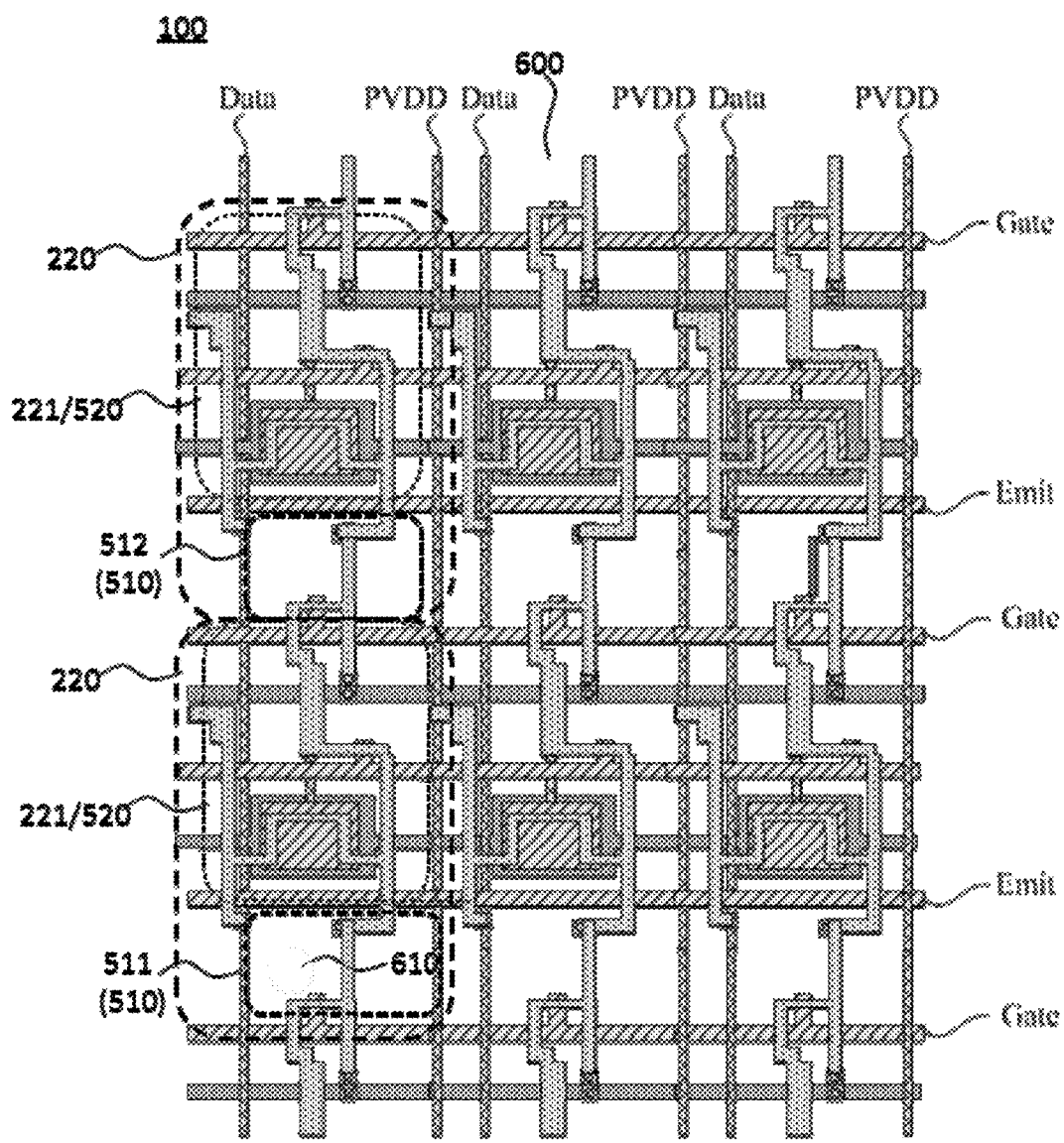
FIG. 6 illustrates a schematic structural diagram of an array layer consistent with the disclosed embodiments of the present disclosure.

FIG. 6 illustrates a schematic structural diagram of an array layer consistent with the disclosed embodiments of the present disclosure. The structure shown in FIG. 6 is used as an example for illustrating the formation of the light-transmitting area and the non-light-transmitting area of the device layer. It should be noted that the circuit structure of the array layer of the present disclosure is not limited to the structure shown in FIG. 6.

The array layer 200 is disposed with a plurality of gate lines Gate extending in a row direction and a plurality of data lines Data extending in a column direction. Intersection of the plurality of gate lines Gate and the plurality of data lines Data defines a plurality of pixel regions 220. Each pixel region 220 includes a circuit structure 221, that is, a pixel circuit. The pixel circuits are arranged in a matrix.

The array layer 200 is also disposed with a plurality of light-emitting control signal lines Emit extending in the row direction and partially overlapping the data line Data in an insulated way, and a plurality of power signal lines PVDD extending in a column direction and partially overlapping the gate lines Gate in an insulated way. The light-emitting control signal lines Emit and the power signal lines PVDD may define a first light-transmitting area 511, a second light-transmitting area 512, and a non-light-transmitting area 520 in the pixel region 220. An area where the circuit structure 221 is located is in the non-light-transmitting area 520. It should be noted that an area that is not blocked by the circuit structure but has a width less than approximately 5 μm is regarded as a non-light-transmitting area.

Optionally, the first opening 610 is an imaging small aperture configured for small-aperture imaging. Since the imaging small aperture occupy a small area, in one aspect, the space of the display panel occupied by the imaging small aperture may be small, and in another aspect, the imaging small apertured may keep away from other structures in the display panel. In addition, according to the principle of small-aperture imaging, in a small-aperture imaging, the path of light reflected by the touch surface is not similar to a vertical orthographic projection on the plane of the substrate. An area of the touch surface corresponding to the optical information that may be read by the small aperture may be larger than the area occupied by the small aperture.

Figure 7:
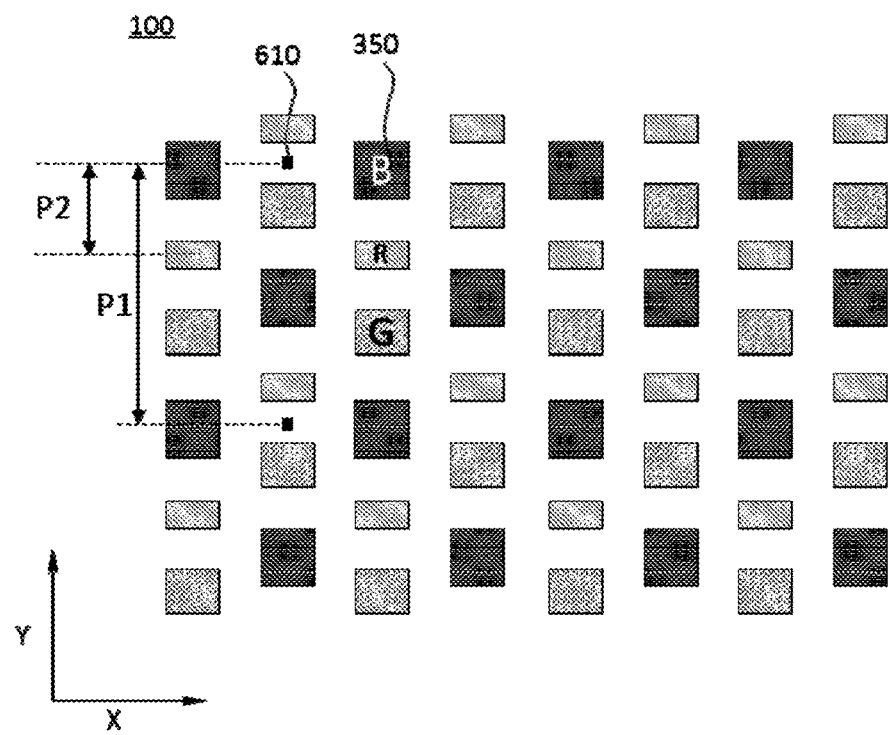
FIG. 7 illustrates a partial schematic diagram of a display panel consistent with the disclosed embodiments of the present disclosure.

FIG. 7 illustrates a partial schematic diagram of a display panel consistent with the disclosed embodiments of the present disclosure. Optionally, as shown in FIG. 7, a density of the imaging small apertures (i.e., the first openings 610) may be less than a density of the pixels. A period P1 of the first openings 610 may be greater than a period P2 of the pixels (or the circuit structures, or the light-emitting devices 350). That is, the period of the first openings 610 may be greater than the period of the light-transmitting region 510. As such, some light-transmitting areas may not correspond to the first openings. These light-transmitting areas may not be used as imaging channels to provide assistance for small-aperture imaging, but may introduce a light leakage problem. In the present disclosure, this type of light-transmitting area is classified as the second light-transmitting area. The light leakage problem may be solved by shielding the second light-transmitting area by an auxiliary light-shielding part.

Figure 8:
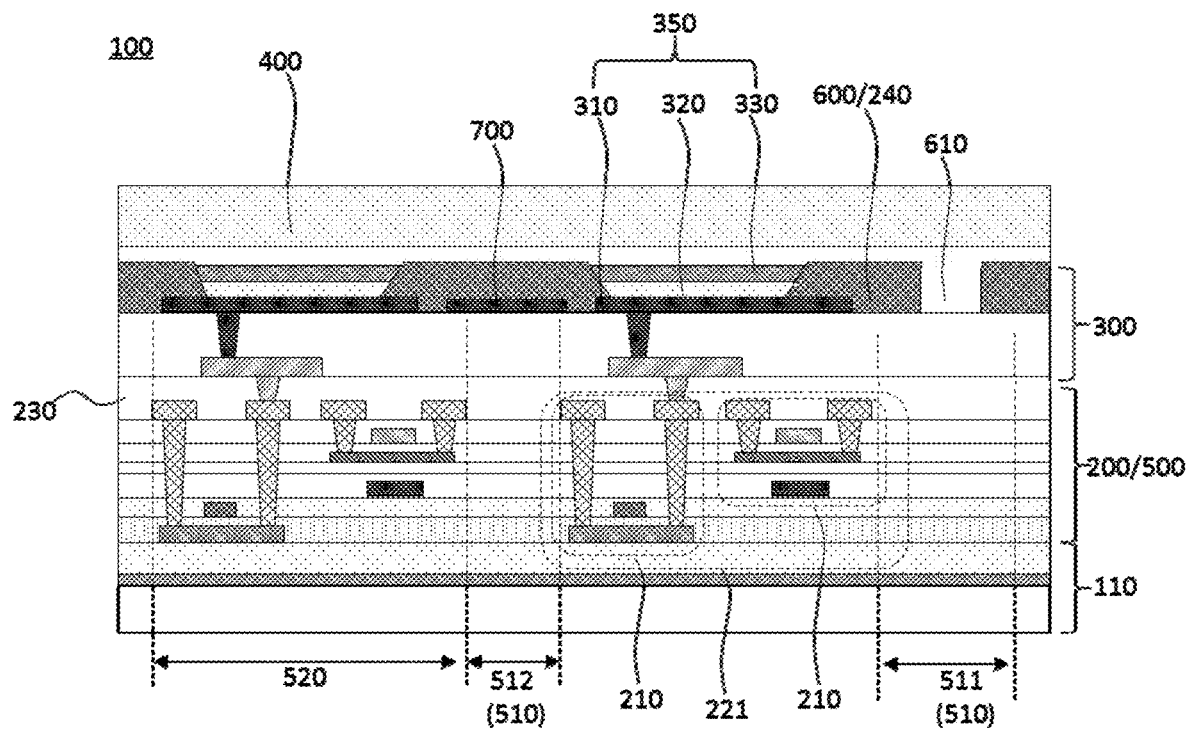
FIG. 8 illustrates another partial cross-sectional view along A-A direction in FIG. 3, consistent with the disclosed embodiments of the present disclosure.

FIG. 8 illustrates another partial cross-sectional view along A-A direction in FIG. 3, consistent with the disclosed embodiments of the present disclosure. The cross section is perpendicular to the plane where the display panel is located. As shown in FIG. 3, FIG. 4, and FIG. 8, in some embodiments of the present disclosure, the display panel 100 also includes an anode 310 on a side of the array layer 200 away from the substrate 110. The auxiliary light-shielding part 700 and the anode 310 may be on a same layer, and may be made of a same material.

Specifically, the display panel 100 also includes a display layer 300 on a side of the array layer 200 away from the substrate 110. The display layer 300 includes a light-emitting device.

Optionally, the display layer 300 is located on the planarization layer 230. The display layer 300 includes the anode 310, an organic light-emitting material 320, and a cathode 330 that are sequentially arranged in a direction away from the substrate 110. The anode 310, the organic light-emitting material 320, and the cathode 330 together form the light-emitting device 350.

Mainly due to following aspects, a design of this configuration may further improve the accuracy of light-sensing detection.

In one aspect, in general, to improve display effect, transmittance of a film layer on an upper side of the light-emitting device (that is, a side facing the light-exiting surface of the display panel) may be relatively high. Accordingly, the auxiliary light-shielding part may not to be disposed on the film layer on the upper side of the light-emitting device, and the film layer on the upper side of the light-emitting device may not be multiplexed as the auxiliary light-shielding part.

In another aspect, the anode is a film layer on a side of the organic light-emitting layer of the light-emitting device away from the light-exiting surface of the display panel. To improve the light exiting rate, a high reflectivity material is generally used. In this way, the light transmittance of the anode material may be quite low, and thus the anode material may be used for making an auxiliary light-shielding layer.

In another aspect, the more the auxiliary light-shielding part may cover the film structure that may form the second light-transmitting area, the better the effect of assisting the first light-shielding layer in improving the difference in light transmission between the first light-transmitting area and the non-light-transmitting area. In other words, the auxiliary light-shielding part closer to the touch surface may cover more film structures that may cause light transmission differences (that is, the film structure generating the second light-transmitting area, such as the circuit structure in the array layer). The anode is the film layer closest to the light-emitting device. In other words, to be close to the touch surface without blocking the display light, a position of the film layer where the anode is located may be a position for achieving the above requirements.

Accordingly, with the above configuration, suitable film layer materials may be multiplexed as the auxiliary function layer, utility of the auxiliary function layer may be maximized, and reliability of the auxiliary function layer may be improved. As such, accuracy of light-sensing detection may be improved.

Optionally, the auxiliary light-shielding part 700 and the anode 310 are in a same layer, and made of a same material. But the auxiliary light-shielding part 700 is spaced apart from the anode.

Figure 9:
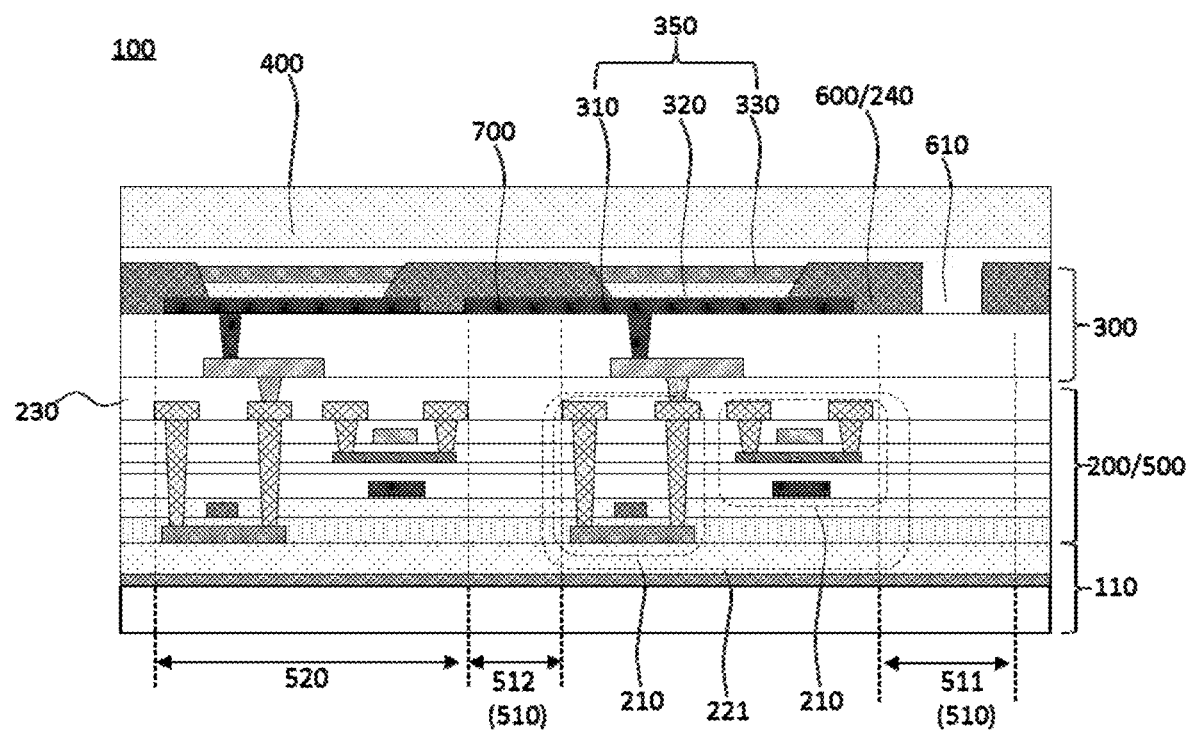
FIG. 9 illustrates another partial cross-sectional view along A-A direction in FIG. 3, consistent with the disclosed embodiments of the present disclosure.

FIG. 9 illustrates another partial cross-sectional view along A-A direction in FIG. 3, consistent with the disclosed embodiments of the present disclosure. The cross section is perpendicular to the plane where the display panel is located.

Optionally, as shown in FIG. 9, the auxiliary light-shielding part 700 may be integrally formed with the anode 310. That is, the auxiliary light-shielding part 700 may be formed by extending the anode 310. By multiplexing the anode as the auxiliary light-shielding part, since an additional extended pattern of the anode may have relatively little impact on the electrical properties of the pixel, a risk of causing uneven display by the auxiliary light-shielding part may be small. In addition, an area of the pattern that needs to be etched may be indirectly increased by connecting the auxiliary light-shielding part and the anode, and production difficulty may thus be decreased. Moreover, an area of the auxiliary light-shielding part may be increased, and the possibility of light leakage through the gap may be reduced. Accordingly, while improving the accuracy of light-sensing detection without affecting display quality, the present disclosure may reduce the process difficulty.

Figure 10:
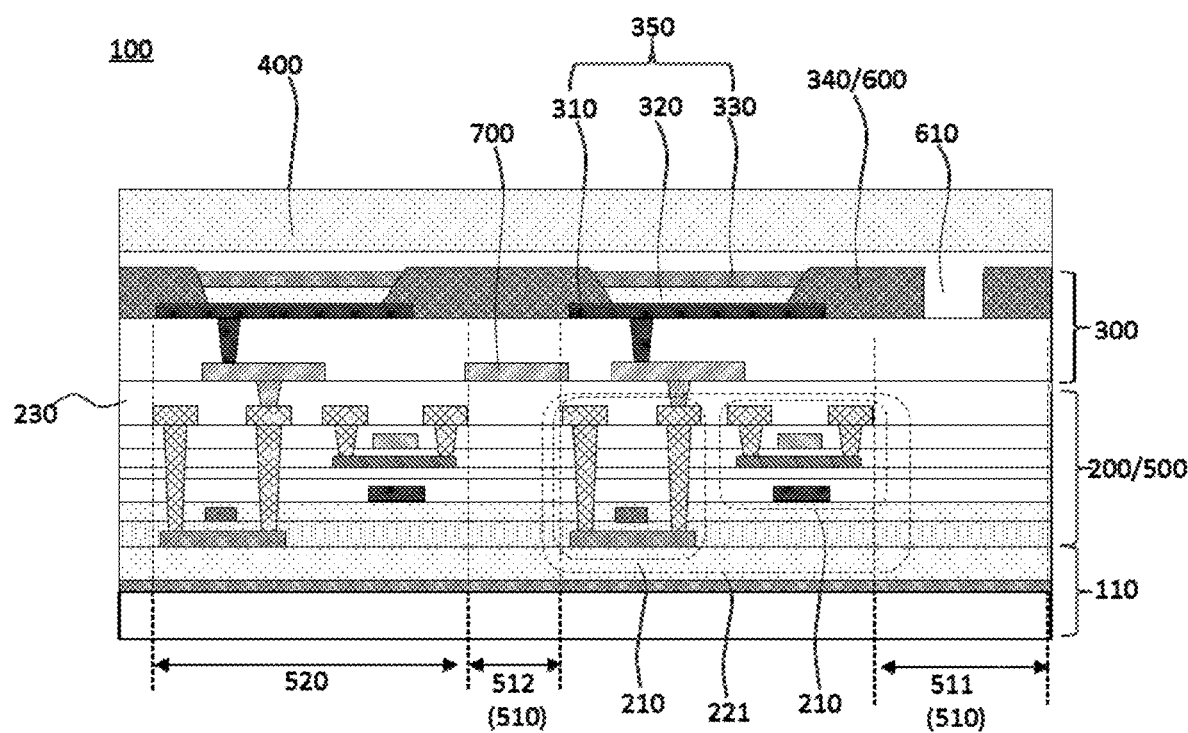
FIG. 10 illustrates another partial cross-sectional view along A-A direction in FIG. 3, consistent with the disclosed embodiments of the present disclosure.

FIG. 10 illustrates another partial cross-sectional view along A-A direction in FIG. 3, consistent with the disclosed embodiments of the present disclosure. The cross section is perpendicular to the plane where the display panel is located. In some embodiments of the present disclosure, as shown in FIG. 3, FIG. 4, and FIG. 10, the display panel may also include a pixel defining layer on a side of the array layer away from the substrate. The pixel defining layer may be multiplexed as the first light-shielding layer. Specifically, as shown in FIG. 10, the display layer 300 also includes a pixel defining layer 340 on a side of the anode 310 away from the array layer 200.

Optionally, the pixel defining layer 340 may be made of organic materials such as polyimide (PI), polyamide, benzocyclobutene (BCB), acrylic resin, or phenolic resin, or may be made of inorganic materials such as SiNx.

Optionally, the anode 310 on the side of the array layer 200 away from the substrate 110 includes a plurality of anode patterns in one-to-one correspondence to the pixels. The anode 310 is electrically connected to the circuit structure 221 in the array layer 200. The pixel defining layer 340 includes a plurality of openings exposing the anode layer 310, and the pixel defining layer 340 covers an edge of the anode 310 pattern. The organic light-emitting material 320 is at least partially filled in the opening of the pixel defining layer 340, and is in contact with the anode 310.

Optionally, the anode 310, the organic light-emitting material 320, and the cathode 330 limited by each opening of the pixel defining layer 340 may constitute a light-emitting device 350. Each light-emitting device 350 may emit light of a different color according to a different organic light-emitting material 320. Each light-emitting device 350 may constitute a pixel (in other words, each light-emitting device and the pixel circuit that controls the light-emitting device together constitute a pixel). A plurality of pixels jointly displays an image.

Optionally, the organic light-emitting material 320 may be formed in the opening of the pixel defining layer 340 by using a method such as inkjet printing, nozzle printing, or evaporation. The cathode 330 may be formed by evaporation on a film layer where the organic light-emitting material 320 is located. Optionally, the cathode 330 may cover an entire surface of the organic light-emitting material 320 and the pixel defining layer 340.

Optionally, the pixel defining layer 340 may be multiplexed as the first light-shielding layer 600. The first light-shielding layer 600 may also include a second opening. The second opening is an opening of the pixel defining layer 340.

In this configuration, in one aspect, as analyzed above, to improve display effect, generally, the transmittance of the film layer on the upper side of the light-emitting device (that is, a side facing the light-exiting surface of the display panel) is relatively high. Accordingly, a film layer with a whole-surface or large-area film layer having a light-shielding function may not be disposed on the upper side of the light-emitting device. The pixel defining layer is a film layer closest to the light-emitting device, or even the pixel defining layer and the light-emitting device may be in a same layer. As such, the pixel defining layer may provide material choices of internal film layers of the display panel to be multiplexed as the auxiliary light-shielding part, without blocking light emission. Further, the auxiliary light-shielding part may also be close to the touch surface to improve the light-sensing detection effect. In addition, for light-sensing detection in a small-aperture imaging mode, in this configuration, an object distance and an image distance required by the small-aperture imaging principle may be satisfied, and a thickness of the small aperture imaging model may be reduced.

In another aspect, the pixel defining layer needs to have a certain thickness to form an opening of the pixel defining layer to accommodate the light-emitting device. In addition, since the pixel defining layer is multiplexed as the auxiliary light-shielding part, the pixel defining layer needs to be patterned to form the first opening and the second opening. Accordingly, the pixel defining layer needs to have a certain light transmittance to achieve precise etching. By combining with the auxiliary light-shielding part, the pixel defining layer may satisfy patterning requirements, and meanwhile have light-shielding capability.

In another aspect, the pixel defining layer is the film layer closest to the light-emitting device, or even the pixel defining layer and light-emitting device may be in a same layer. Accordingly, the reflection light of the film layer under the light-emitting device may be blocked without blocking light emission, and the display effect may thus be improved.

With continuous reference to FIG. 8, optionally, the pixel defining layer is multiplexed as the first light-shielding layer. In addition, the auxiliary light-shielding part 700 and the anode 310 are in a same layer, are made of in a same material.

The anode is a film layer on a side of the organic light-emitting layer forming the light-emitting device, facing away from the light-exiting surface of the display panel. To improve the light exiting rate, a high-reflectivity material is generally used. In one embodiment, the auxiliary light-shielding part and the anode are in a same layer, and the first light-shielding layer is multiplexed as the pixel defining layer. In addition to the technical effects of described above, requirements on materials for the first light-shielding layer and the pixel defining layer may be met, and functional effects of the first light-shielding layer and the pixel defining layer may be improved. In addition, the first light-shielding layer may shield the reflection light of the auxiliary light-shielding part. Furthermore, in such a design, the auxiliary light-shielding part and the first light-shielding layer may be arranged adjacent to each other. Materials of the auxiliary light-shielding part and the first light-shielding layer may be complementary, and leakage of interference light from a gap between the auxiliary light-shielding part and the first light-shielding layer may be decreased.

Optionally, the display panel 100 also includes an encapsulation layer 400 on the display layer 300 and completely covers the display layer 300 to seal the display layer 300. Optionally, the encapsulation layer 400 is a thin-film encapsulation layer, located on the cathode 330. The encapsulation layer 400 may include a first inorganic encapsulation layer, a first organic encapsulation layer, and a second inorganic encapsulation layer sequentially arranged along a direction away from the substrate 110. In some other embodiments, the encapsulation layer may include any number of stacked organic materials and inorganic materials as required. The encapsulation layer 400 may include at least one layer of organic material and at least one layer of inorganic material that are deposited alternately, and the lowermost layer and the uppermost layer are made of an inorganic material.

In addition, in the present disclosure, optionally, the display panel 100 also includes a fingerprint identification device 800. The fingerprint identification device 800 includes an aforementioned light-sensing element, that is, a light-sensing sensor layer.

The display panel in the present disclosure may be an organic light-emitting display panel. The light-emitting element may be multiplexed as a light source of the fingerprint identification device (light-sensing sensor layer). Accordingly, a separate light source for the fingerprint identification device may not be needed in the display panel, and the display panel may thus have a simple structure and a simple film layer relationship. As such, a light and thin design of the display panel may be realized.

In one embodiment of the present disclosure, the display panel may also include a fingerprint recognition light source (not shown in the figures). The fingerprint recognition light source alone provides a light source for the light-sensing layer, such that the fingerprint recognition device may have multiple functions. For example, the fingerprint recognition light source may be an infrared light source. Accordingly, the fingerprint recognition device may not only recognize fingerprints, but also identify a blood flow status of a human body and monitor human health.

Figure 11:
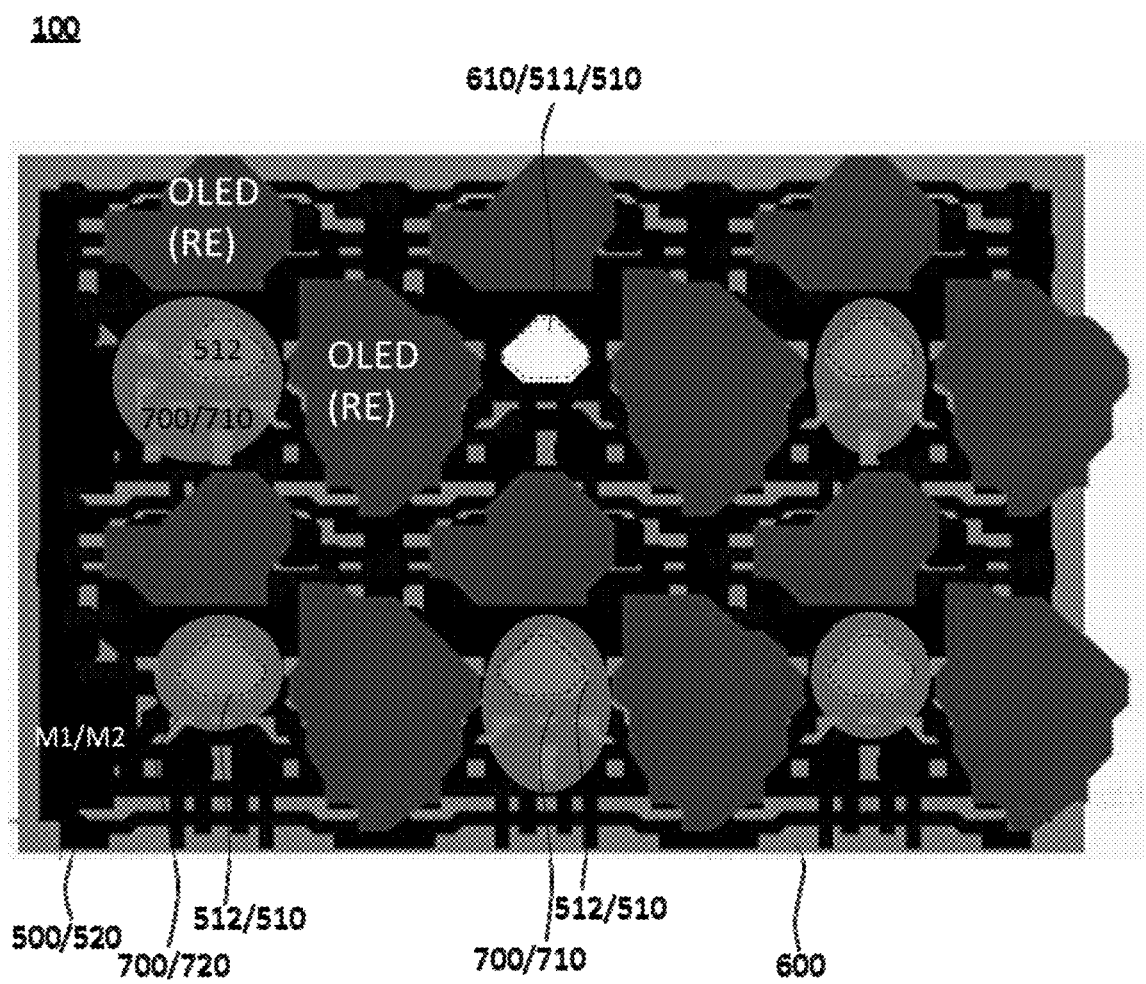
FIG. 11 illustrates another partial enlarged view of a display panel shown in FIG. 3, consistent with the disclosed embodiments of the present disclosure.

FIG. 11 illustrates another partial enlarged view of the display panel shown in FIG. 3, consistent with the disclosed embodiments of the present disclosure. In one embodiment, as shown in FIG. 11, the auxiliary light-shielding part 700 includes a first auxiliary light-shielding part 710 and a second auxiliary light-shielding part 720.

A distance from the first auxiliary light-shielding part 710 to the adjacent first light-transmitting area 511 is smaller than a distance from the second auxiliary light-shielding part 720 to the adjacent first light-transmitting area 511. An area of the first auxiliary light-shielding part is larger than an area of the second auxiliary light-shielding part.

Optionally, the first light-transmitting regions 511 are arranged periodically. Two closest first light-transmitting regions 511 are separated by a second light-transmitting region 512. Taking the period of the first light-transmitting area 511 as a limiting range, a plurality of cyclic units arranged in an array may be limited. The light-transmitting areas 510 in a same cyclic unit includes a plurality of second light-transmitting areas 212. The plurality of second light-transmitting area 512 and the auxiliary light-shielding parts 700 have a one-to-one corresponding relationship. Then, the auxiliary light-shielding part 700 corresponding to the second light-transmitting area 512 closer to the first light-shielding area 511 is the first auxiliary light-shielding part 710. The auxiliary light-shielding part 700 corresponding to the second light-transmitting area 512 farther from the first light-shielding area 511 is the second auxiliary light-shielding part 720.

Optionally, an area of the first auxiliary light-shielding part 710 is larger than an area of the second auxiliary light-shielding part 720. An area of an orthographic projection of the first auxiliary light-shielding part 710 on the plane of the display panel 100 is larger than an area of an orthographic projection of the second auxiliary light-shielding part 720 on the plane of the display panel 100.

In this configuration, the area of the auxiliary light-shielding part corresponding to the second light-transmitting area with higher risk is increased. Accordingly, the area of the auxiliary light-shielding part is set with more pertinence. As such, while saving the occupied space, the light-shielding effect of the first light-shielding part may be improved, and the utility of the auxiliary light-shielding part may be maximized.

Figure 12:
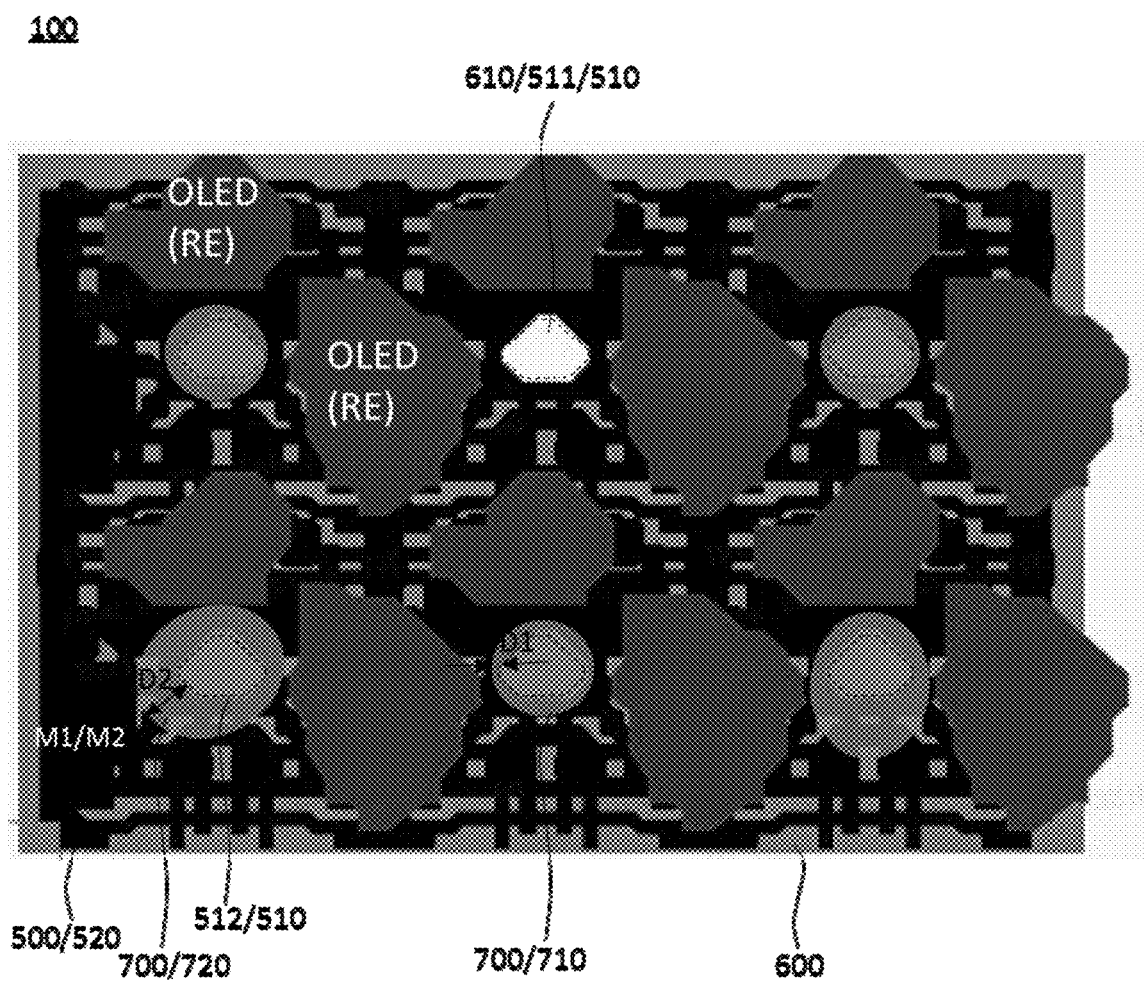
FIG. 12 illustrates another partial enlarged view of a display panel shown in FIG. 3, consistent with the disclosed embodiments of the present disclosure.

FIG. 12 illustrates another partial enlarged view of the display panel shown in FIG. 3, consistent with the disclosed embodiments of the present disclosure. In one embodiment, as shown in FIG. 12, the auxiliary light-shielding part 700 includes a first auxiliary light-shielding part 710 and a second auxiliary light-shielding part 720.

A distance from the first auxiliary light-shielding part 710 to the adjacent first light-transmitting area 511 is smaller than a distance from the second auxiliary light-shielding part 720 to the adjacent first light-transmitting area 511.

A size of a portion of the first auxiliary light-shielding part 710 that exceeds the corresponding second light-transmitting area 512 is smaller than a size of a portion of the second auxiliary light-shielding part 720 that exceeds the corresponding second light-transmitting area 512.

Specifically, an orthographic projection of the second light-transmitting area 512 on the plane where the display panel 100 is located falls within an orthographic projection of the auxiliary light-shielding part 700 on the plane where the display panel 100 is located. In addition, an edge of the orthographic projection of the auxiliary light-shielding part 700 on the plane where the display panel 100 is located exceeds an edge of the orthographic projection of the second light-transmitting area 512 on the plane where the display panel 100 is located.

Further, a distance between the edge of the orthographic projection of the first auxiliary light-shielding part 710 on the plane where the display panel 100 is located and the edge of the orthographic projection of the second light-transmitting area 512, covered by the first auxiliary light-shielding part 710, on the plane where the display panel 100 is located is D1. A distance between the edge of the orthographic projection of the second auxiliary light-shielding part 720 on the plane where the display panel 100 is located and the edge of the orthographic projection of the second light-transmitting area 512, covered by the second auxiliary light-shielding part 720, on the plane where the display panel 100 is located is D2, where D1<D2.

It should be noted that for small-aperture imaging, an edge of an image formed by an imaging small aperture may be blurred. In other words, an image formed by an area farther from the first opening may have more light loss because the light may travel farther to the first opening, and thus the image may be blurred. In one embodiment, shielding degrees of the second light-transmitting areas of different regions may be set differently. By increasing the shielding degree of the second light-transmitting area farther from the first opening, brightness of an edge area of the cyclic unit may be darker, the interference light may be less, and the image of the edge area read by the light-sensing device may be clearer.

Figure 13:
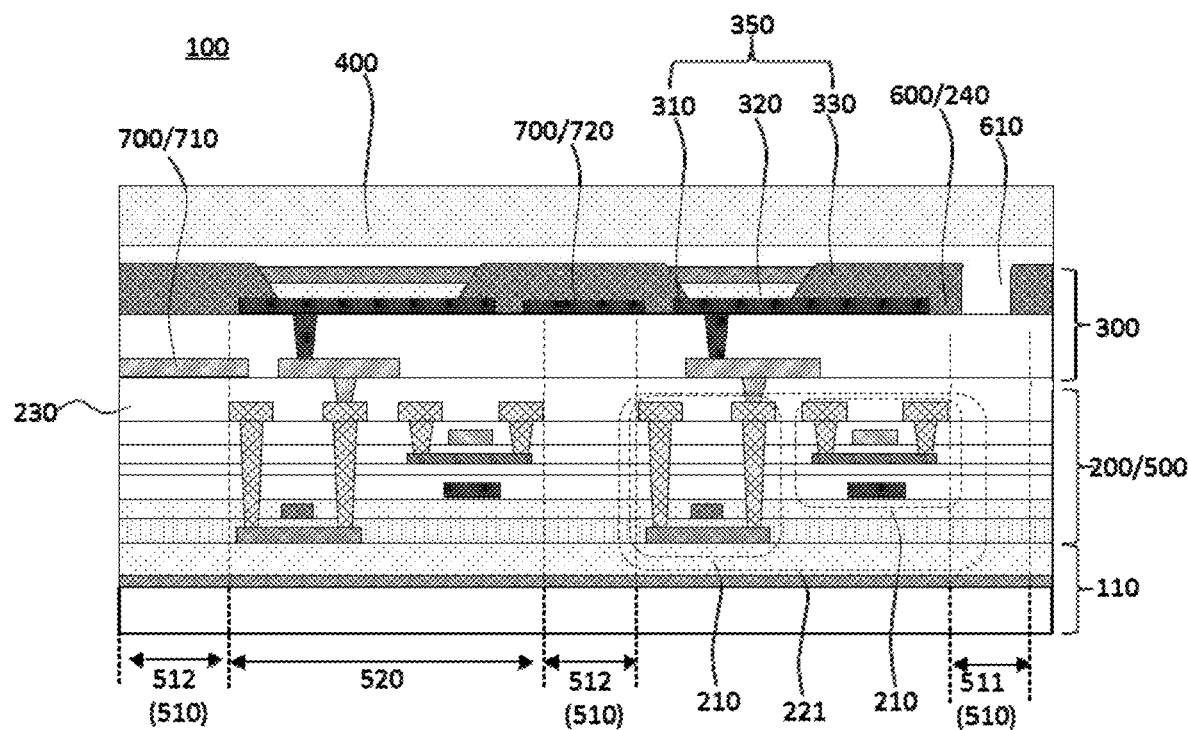
FIG. 13 illustrates another partial cross-sectional view along A-A direction in FIG. 3, consistent with the disclosed embodiments of the present disclosure.

FIG. 13 illustrates another partial cross-sectional view along A-A direction in FIG. 3, consistent with the disclosed embodiments of the present disclosure. The cross section is perpendicular to the plane where the display panel is located. In one embodiment, as shown in FIG. 13, the auxiliary light-shielding part 700 includes a first auxiliary light-shielding part 710 and a second auxiliary light-shielding part 720. The first auxiliary light-shielding part 710 and the second auxiliary light-shielding part 720 are located in different layers.

Optionally, different metal layers in the display panel are multiplexed as the first auxiliary light-shielding part 710 and the second auxiliary light-shielding part 720 respectively.

In this configuration, the first auxiliary light-shielding part 710 and the second auxiliary light-shielding part 720 may not occupy too much area on a same metal layer, and thus arrangement of other devices may not be affected.

Figure 14:
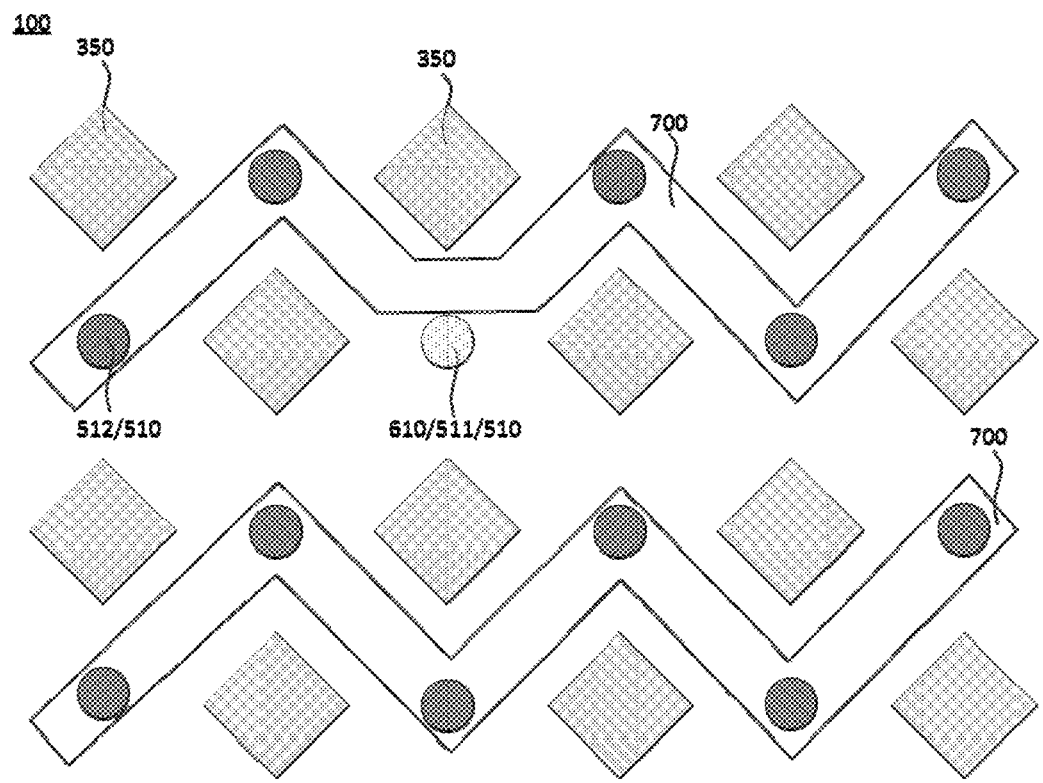
FIG. 14 illustrates another partial enlarged view of a display panel shown in FIG. 3, consistent with the disclosed embodiments of the present disclosure.

FIG. 14 illustrates another partial enlarged view of the display panel shown in FIG. 3, consistent with the disclosed embodiments of the present disclosure. Optionally, as shown in FIG. 14, the auxiliary light-shielding part 700 may be multiplexed as a signal line.

Optionally, a plurality of auxiliary light-shielding parts corresponding to different second light-transmitting regions are connected to each other, such that the auxiliary light-shielding parts may form a line.

Optionally, the auxiliary light-shielding part and the anode are on a same layer. Since the anode has an island structure, the anode may provide a path for connecting the auxiliary light-shielding parts to each other.

Optionally, a reset line, that is, a Vref line, may be multiplexed as the auxiliary light-shielding part.

In this configuration, the space for the auxiliary light-shielding part may be reduced, while the auxiliary light-shielding part may reduce the resistance of a line.

Optionally, a width of the line multiplexed as the auxiliary light-shielding part at a position far away from the first opening is larger than a width of the line multiplexed as the auxiliary light-shielding part at a position close to the first opening. The line at a position close to the first opening corresponds to the first auxiliary light-shielding part, and a size of a part that exceeds the corresponding second light-transmitting area is small. The line far away from the first opening corresponds to the second auxiliary light-shielding part, and a size of a part that exceeds the corresponding second light-transmitting area is large.

Figure 15:
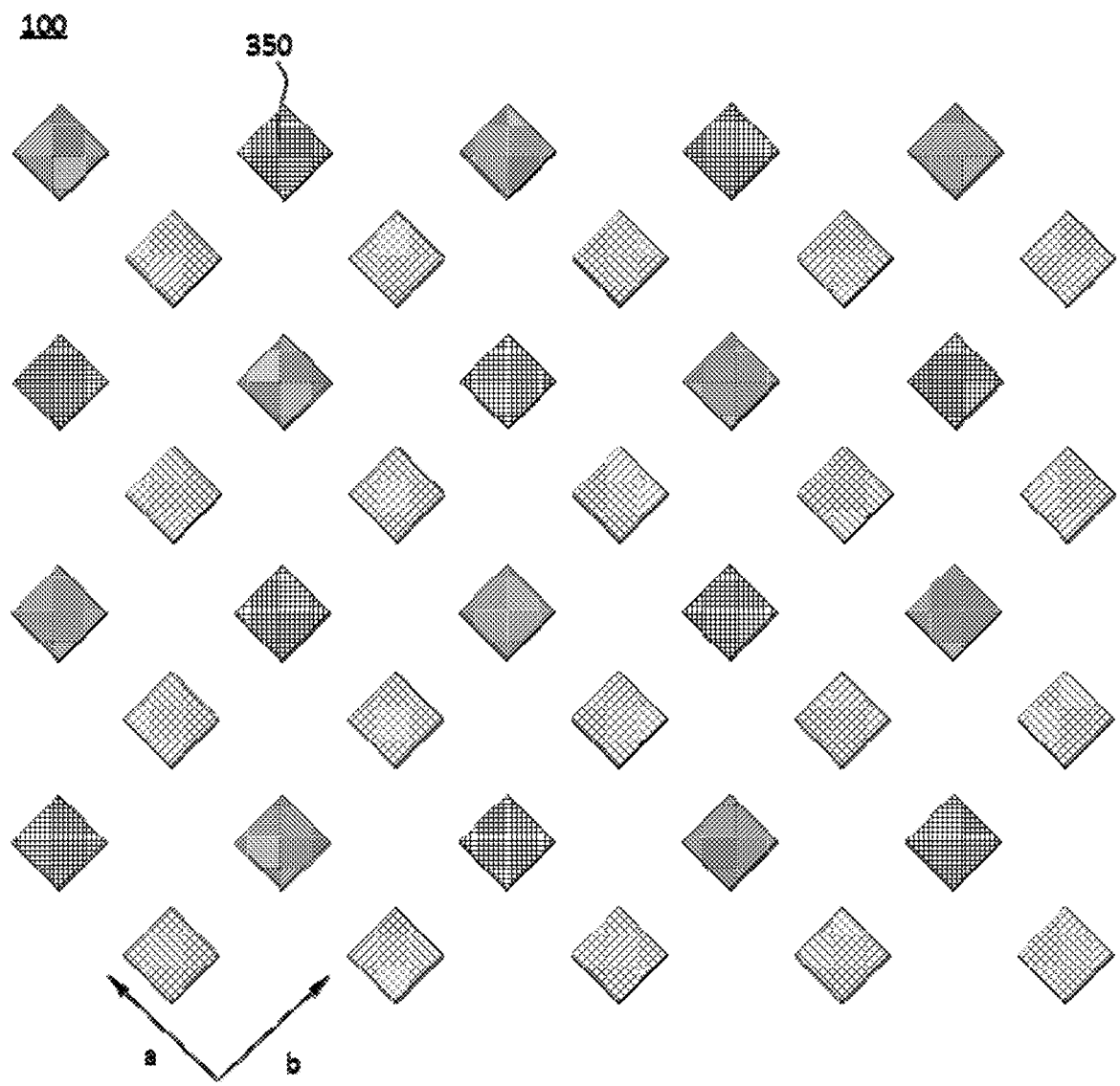
FIG. 15 illustrates another partial enlarged view of a display panel shown in FIG. 3, consistent with the disclosed embodiments of the present disclosure.

FIG. 15 illustrates another partial enlarged view of the display panel shown in FIG. 3, consistent with the disclosed embodiments of the present disclosure. In one embodiment, as shown in FIG. 15, the display panel 100 also includes light-emitting devices 350 arranged in an array. The light-emitting devices 350 have a same arrangement pattern in a first direction a and a second direction b are same. In other words, openings of the pixel defining layer also exhibit the above-mentioned array arrangement. The first direction a intersects the second direction b. The first direction a and the second direction b are each parallel to a direction of the plane where the display panel is located. Optionally, the first direction a is perpendicular to the second direction b. Optionally, arrangement periods of the light-emitting devices 350 in the first direction a and the second direction b are same, that is, the light-emitting devices 350 are arranged at a same interval.

In this configuration, the pixel arrangement is similar to an arrangement of a windmill. The first direction and the second direction have consistent periodicity, such that the array arrangement of the first openings (i.e., imaging small apertures) may have more flexibility.

Optionally, the period of the first opening is an integer multiple of the pixel period. Since the pixel arrangement has a same period in the first direction and the second direction, the arrangement of the first opening in the first direction and the second direction may keep consistent, such that the light-sensing detection may be uniform.

Figure 16:
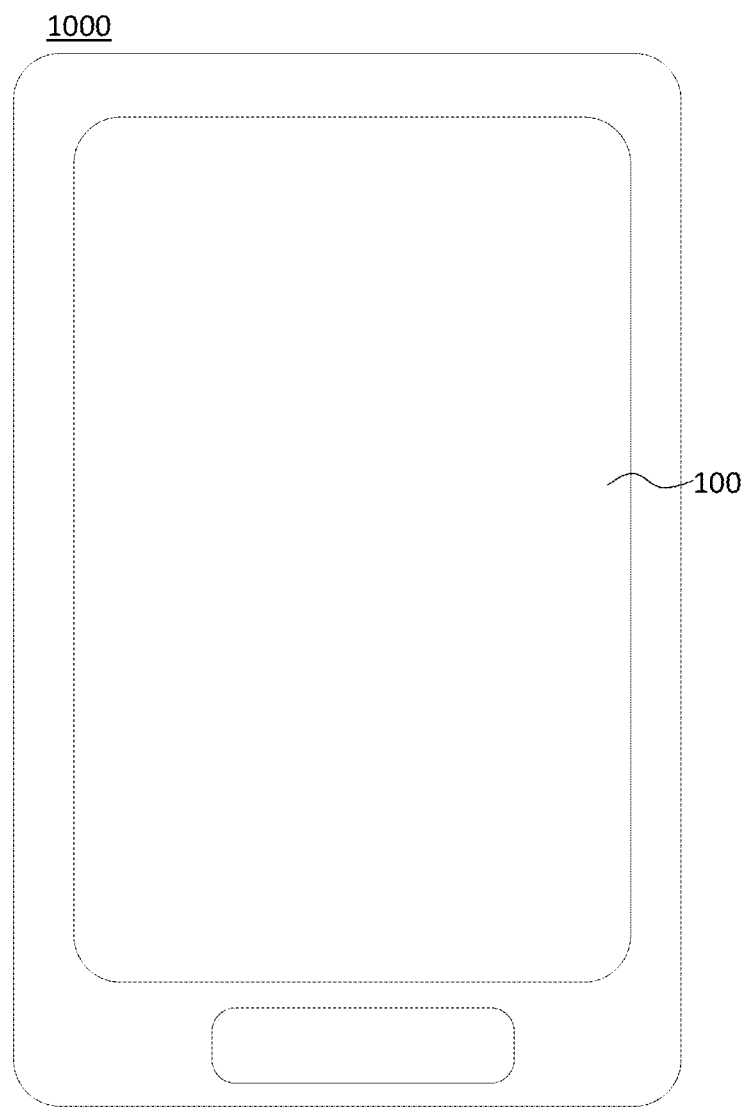
FIG. 16 illustrates a schematic structural diagram of a display device consistent with the disclosed embodiments of the present disclosure.

The present disclosure also provides a display device, including a display panel provided by the present disclosure. FIG. 16 illustrates a schematic structural diagram of a display device consistent with the disclosed embodiments of the present disclosure. In one embodiment, as shown in FIG. 16, the display device 1000 includes a display panel 100 provided by the present disclosure. FIG. 16 uses a mobile phone as an example to illustrate the display device 1000. It may be understood that the display device provided by the present disclosure may be a computer, a television, a vehicle-mounted display device, or other display devices with a display function, and is not specifically limited by the present disclosure. The display device provided by the present disclosure may have beneficial effects of the display panel provided by the present disclosure.

As disclosed, the technical solutions of the present disclosure have the following advantages.

In the present disclosure, the auxiliary light-shielding part may shield the second light-transmitting area, and the accuracy of light-sensing detection may thus be improved.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A display panel, comprising:
   a first light-shielding layer including at least one first opening;
   a device layer including a plurality of light-transmitting regions, wherein the plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening; and
   an auxiliary light-shielding part overlapping the second light-transmitting area,
   wherein:
   the device layer includes a circuit structure, and at least a part of the circuit structure forms a non-light-transmitting area;
   at least a part of the auxiliary light-shielding part does not overlap the non-light-transmitting area formed by the circuit structure; and
   the plurality of light-transmitting regions overlaps at least a portion of the non-light-transmitting area in a direction parallel to a plane where the display panel is located.

2. The display panel according to claim 1, wherein:
   the second light-transmitting area has a width greater than or equal to approximately 5 µm.

3. The display panel according to claim 1, wherein:
   the first light-shielding layer is a continuous insulating layer.

4. The display panel according to claim 1, wherein:
   the first light-shielding layer has a light transmittance in a range approximately 1%-50%.

5. The display panel according to claim 1, wherein:
   the auxiliary light-shielding part is made of a material including a metal material.

6. The display panel according to claim 1, wherein:
   the auxiliary light-shielding part is located between the second light-transmitting area and the first light-shielding layer.

7. The display panel according to claim 1, further comprising:
   a substrate; and
   an array layer located on a side of the substrate, wherein:
   the device layer is located on the array layer.

8. The display panel according to claim 1, further comprising:
   a substrate;
   an array layer located on a side of the substrate; and
   a pixel defining layer on a side of the array layer away from the substrate, wherein the pixel defining layer is multiplexed as the first light-shielding layer.

9. The display panel according to claim 1, further comprising:
   a substrate;
   an array layer located on a side of the substrate; and an anode on a side of the array layer away from the substrate, wherein the auxiliary light-shielding part and the anode are on a same layer, and made of a same material.

10. The display panel according to claim 1, wherein:
the auxiliary light-shielding part is multiplexed as a signal line.

11. The display panel according to claim 1, wherein:
the auxiliary light-shielding part is connected to a fixed electric potential or a shielding signal.

12. The display panel according to claim 1, wherein:
the auxiliary light-shielding part includes a first auxiliary light-shielding part and a second auxiliary light-shielding part;
a distance from the first auxiliary light-shielding part to an adjacent first light-transmitting area is smaller than a distance from the second auxiliary light-shielding part to the adjacent first light-transmitting area; and
an area of the first auxiliary light-shielding part is larger than an area of the second auxiliary light-shielding part.

13. The display panel according to claim 1, wherein:
the auxiliary light-shielding part includes a first auxiliary light-shielding part and a second auxiliary light-shielding part;
a distance from the first auxiliary light-shielding part to an adjacent first light-transmitting area is smaller than a distance from the second auxiliary light-shielding part to the adjacent first light-transmitting area; and
a size of a portion of the first auxiliary light-shielding part that exceeds a corresponding second light-transmitting area is smaller than a size of a portion of the second auxiliary light-shielding part that exceeds a corresponding second light-transmitting area.

14. The display panel according to claim 1, wherein:
the auxiliary light-shielding part includes a first auxiliary light-shielding part and a second auxiliary light-shielding part; and
the first auxiliary light-shielding part and the second auxiliary light-shielding part are located in different layers.

15. The display panel according to claim 1, further comprising light-emitting devices arranged in an array, wherein:
the light-emitting devices have a same arrangement pattern in a first direction and a second direction; and
the first direction intersects the second direction.

16. The display panel according to claim 7, wherein:
the array layer includes a plurality of gate lines extending in a row direction and a plurality of data lines extending in a column direction;
intersection of the plurality of gate lines and the plurality of data lines defines a plurality of pixel regions; and
each pixel region of the plurality of pixel regions includes the circuit structure.

17. The display panel according to claim 16, wherein:
the array layer further includes a plurality of light-emitting control signal lines extending in the row direction and partially overlapping the plurality of data lines in an insulated way, and a plurality of power signal lines extending in the column direction and partially overlapping the plurality of gate lines in an insulated way;
the plurality of light-emitting control signal lines and the plurality of power signal lines define the first light-transmitting area, the second light-transmitting area, and the non-light-transmitting area in the pixel region; and
the circuit structure is located in the non-light-transmitting area.

18. The display panel according to claim 1, further comprising a fingerprint identification device, wherein:
the fingerprint identification device includes a light-sensing element.

19. A display device, comprising a display panel, wherein the display panel includes:
a first light-shielding layer including at least one first opening;
a device layer including a plurality of light-transmitting regions, wherein the plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening; and
an auxiliary light-shielding part overlapping the second light-transmitting area,
wherein:
the device layer includes a circuit structure, and at least a part of the circuit structure forms a non-light-transmitting area;
at least a part of the auxiliary light-shielding part does not overlap the non-light-transmitting area formed by the circuit structure; and
the plurality of light-transmitting regions overlaps at least a portion of the non-light-transmitting area in a direction parallel to a plane where the display panel is located.

20. A display panel, comprising:
a first light-shielding layer including at least one first opening;
a device layer including a plurality of light-transmitting regions, wherein the plurality of light-transmitting regions includes a first light-transmitting region and a second light-transmitting region, the first light-transmitting area overlaps at least one of the at least one first opening, and the second light-transmitting area overlaps a portion of the first light-shielding layer except the at least one first opening; and
an auxiliary light-shielding part overlapping and completely covering the second light-transmitting area,
wherein:
the device layer includes a circuit structure, and at least a part of the circuit structure forms a non-light-transmitting area; and
at least a part of the auxiliary light-shielding part does not overlap the non-light-transmitting area formed by the circuit structure.

* * * * *